United States Patent

Lederer

[15] 3,706,409

[45] Dec. 19, 1972

[54] SEMICONDUCTOR LEAD ATTACHMENT SYSTEM INCLUDING A SEMICONDUCTOR PELLET ORIENTATION PLATE

[72] Inventor: Edwin H. Lederer, Syracuse, N.Y.

[73] Assignee: General Electric Company

[22] Filed: Feb. 26, 1970

[21] Appl. No.: 14,376

[52] U.S. Cl. ..........................228/6, 228/47, 29/589, 29/418

[51] Int. Cl. ..........................................B23k 1/00

[58] Field of Search..........................228/4–6, 19, 20, 228/47; 29/423, 418, 41

[56] References Cited

UNITED STATES PATENTS

| | | | |
|---|---|---|---|
| 3,014,447 | 12/1961 | Walker et al. | 228/41 |
| 3,180,551 | 4/1965 | Richard et al. | 228/47 |

*Primary Examiner*—Charles W. Lanham
*Assistant Examiner*—W. Tupman
*Attorney*—Robert J. Mooney, Nathan J. Cornfeld, Frank L. Neuhauser, Oscar B. Waddell and Joseph B. Forman

[57] ABSTRACT

This invention relates to a semiconductor lead attachment system which is particularly useful in the automatic application of external leads to contact areas formed on pellets or dice of semiconductor material. These pellets, prior to subdivision of the pellets from the parent wafer which they constitute, are precisely engaged with and located on a pellet orientation plate. This is accomplished by attaching the parent wafer to the top surface of the orientation plate with a thermally releasable adhesive layer and subdividing the parent wafer with a plurality of grooves into individual pellets while at the same time forming a network of pedestal-shaped supports in the orientation plate which are thermally isolated from each other. Each individual pellet is then selectively released and removed from the orientation plate during the course of heating each pellet while the leads are being bonded thereto.

2 Claims, 6 Drawing Figures

PATENTED DEC 19 1972

3,706,409

Figure 1:
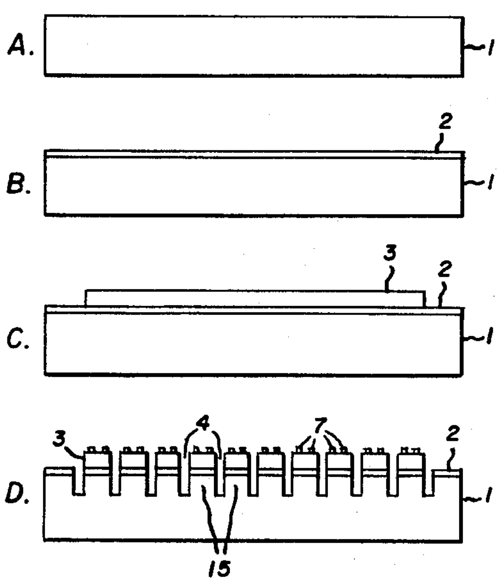

INVENTOR:
EDWIN H. LEDERER,
BY Robert J. Mooney
HIS ATTORNEY.

SEMICONDUCTOR LEAD ATTACHMENT SYSTEM INCLUDING A SEMICONDUCTOR PELLET ORIENTATION PLATE

My invention relates to a semiconductor lead attachment system including a pellet orientation plate for maintaining the precise orientation of a subdivided semiconductor pellet in relationship with its parent wafer during the fabrication of semiconductor devices.

In the art of manufacturing semiconductor devices such as transistors and monolithic integrated circuits, techniques for batch fabrication of such devices in slices or wafers or layers of semiconductor material have been refined to a high degree. These techniques not only insure desirable uniformity of devices in the batch, but greatly reduce the handling and other direct labor involvement per device, with resultant achievement of very low manufacturing cost for the semiconductor body portion of each device. Even the application of metallic contact materials or pads to selected contact areas on the semiconductor body, which may subsequently have external connectors secured to them, is now accomplished by batch fabrication techniques and at very low cost per device.

In spite of these previously achieved savings by the use of batch-fabrication techniques, in various manufacturing steps subsequent to the application of metallic contacts substantial additional costs have been incurred using prior art techniques. For example, heretofore the attachment of external electric connectors to the appropriate metallic contact pads on the semiconductor body portion of each device usually required substantial amounts of direct labor. This direct labor is involved in performing such tasks as subdividing the wafer or otherwise processing it to extract from it the semiconductor body portion of each individual device, manipulating the individual semiconductor body into a desired position at a work station, bringing the necessary external electrical connectors into cooperative relationship or registry with the minute metallic contact pads on the individual semiconductor body, and properly mechanically and electrically securing the connectors to the contact areas. On the basis of cost per finished device, such direct labor-involving steps as above described represent a substantial portion of total device cost, and hence much thought and effort has been directed to the problem of reducing the cost of these steps.

Accordingly, one object of this invention is to provide an improved method and apparatus facilitating low-cost, minimum-labor attachment of external electrical connectors to the metallic contacts on bodies of semiconductor material, which bodies have been previously formed as increments of an integral wafer of such semiconductor material.

Another object is to provide a method and apparatus facilitating processing of a wafer of semiconductor material, which wafer has been previously treated to form therein a plurality of individual useful increments each constituting the semiconductor body portion of an individual semiconductor device, so as to subdivide said wafer into separate individual semiconductor body portions while preserving each separated semiconductor body portion precisely in the exact position relative to its neighbors that it occupied in the undivided parent wafer.

Still another object of this invention is to provide a semiconductor pellet orientation plate for receiving the semiconductor pellets of a subdivided parent wafer and maintaining each such semiconductor pellet exactly in the precise location it occupied relative to its neighboring pellets in the parent wafer.

A further object of this invention is to provide a semiconductor pellet orientation plate of the foregoing character which enables each individual semiconductor pellet supported and maintained thereby to be indexed into and out of a work station with the precision desired for automatic attachment of external electrical connectors to such pellet, while not deleteriously affecting the location of such pellet relative to its neighboring pellets.

Another object of this invention is to provide an improved method and apparatus for presenting at a work station a plurality of discrete, individual pellets of semiconductor material, which originally together constituted a single integral parent wafer or semiconductor material, without changing the relative position or orientation of any of the pellets from the location and orientation they had in the original wafer prior to the subdivision of such wafer into pellets.

Figure 2:
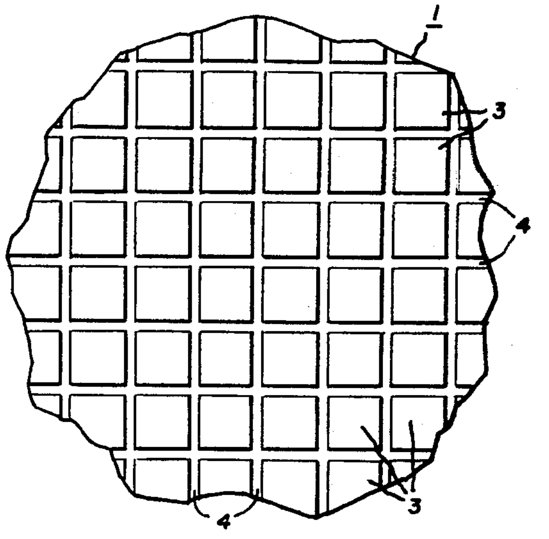
Figure 3:
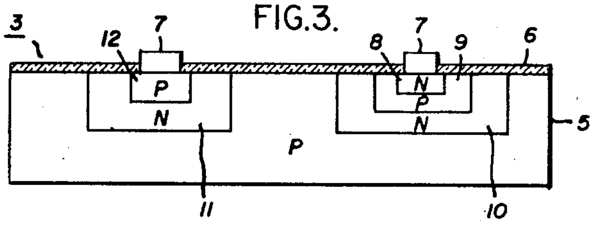
Figure 4:
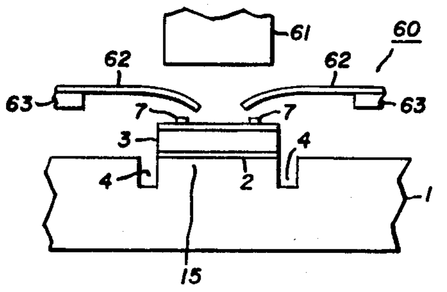
Figure 6:
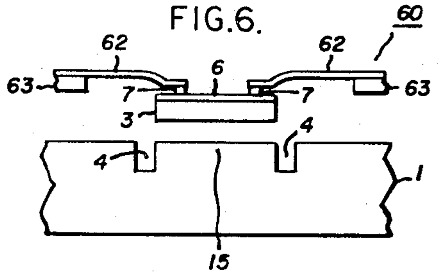
Figure 5:
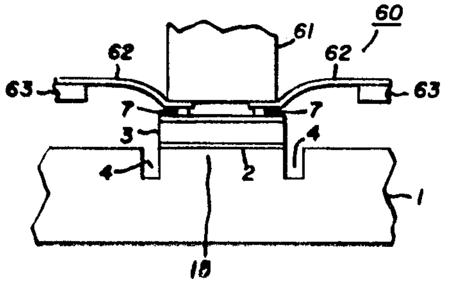

These and other objects of this invention will be apparent from the following description and the accompanying drawing, wherein:

FIG. 1 is an illustration of successive steps in the process of this invention according to one specific embodiment, FIG. 2 is a fragmentary top view, to an enlarged scale, of the structure shown in FIG. 1 at D, FIG. 3 is an enlarged cross-sectional view of a single representative pellet contained in the subdivided wafer shown in FIG. 1, FIG. 4 is an enlarged fragmentary elevation view illustrating precise attachment of external leads to the contact pad of a pellet support by the orientation plate of FIG. 1, FIG. 5 is a view similar to FIG. 4 with the external leads brought into connection-forming contact with the contact pads of a pellet by a suitable bonding tool, and FIG. 6 is another view, similar to FIGS. 4 and 5, of an individual pellet being removed from the orientation plate upon completion of attachment of external leads to its contact pads.

Briefly, my invention relates to a semiconductor lead attachment system which is particularly useful in the automatic application of external leads to contact areas formed on a pellet of semiconductor material. These pellets, prior to subdivision from the parent wafer which they constitute, are precisely engaged with and located on a pellet orientation plate. This is accomplished by attaching the parent wafer to the top surface of the orientation plate with a thermally releasable adhesive layer and then subdividing the parent wafer into individual pellets with a plurality of grooves which extend down into the orientation plate thereby forming a network of pedestal-shaped supports. In this way, the pellets remain in the same relative position and orientation they occupied in the parent wafer and are thermally isolated from each other. The orientation plate supporting the pellets is then presented to a suitable lead attachment work station for attachment of the external leads to contact areas previously formed on the pellet. The attachment is accomplished by placing the leads between a suitable heated bonding tool and the contact areas on an individual pellet. The tool is next brought into engaging relationship with the leads and the contact areas thereby joining them together. The heat from the bonding tool selectively releases the adhesive beneath the individual pellet to which leads are being bonded. The bonding tool is then removed and a lifting action is applied to the leads thereby causing the pellet to be lifted from the top surface of the pedestal. The bonding tool and the orientation plate are then relatively indexed laterally so as to bring another pellet into horizontal registry with the bonding tool and the bonding cycle is repeated until all the pellets have had their leads attached.

Referring now to FIG. 1, in the upper left hand corner thereof, labeled (A), there is shown an enlarged cross sectional view of one form of a semiconductor pellet orientation plate according to the present invention. The plate 1 of FIG. 1A is made of a heat-conductive material. The heat conductivity of this material should be low enough to prevent the pellets, once they are separated from each other, from shifting around while at the same time sufficiently high to allow the softening of the subsequently applied adhesive layer to spread easily onto the plate. Preferably, the coefficient of heat transfer ($k$) value is between 0.1 and 0.7 BTU's/hr/ft$^2$/°F/ft. It is also desirable that the plate 1 be relatively easy to cut into, without undue delay or wear on the means used to do the cutting. In addition, it is desirable that the plate 1 should be sufficiently porous to absorb any excess adhesive material that may be used in subsequent steps of my invention. The heat conductive plate 1 may be made of a material from the group consisting of plastic epoxy materials having fillers such as $Al_2O_3$, $SiO_2$ and talc; ceramics; and glasses, which have the foregoing characteristics. One suitable heat conductive material is Hysol-XSCM11-R454-Epoxy which is manufactured by Hysol Corporation, Olean, New York. Another is Silicone MC-382 Blue manufactured by General Electric Company, Waterford, New York.

In step (B) an adhesive layer 2 has been coated over the top surface of the plate 1. This adhesive layer 2 desirably has a thermally variable adhesiveness such that at an elevated temperature in the range between 150°C and 350°C its adhesiveness will be greatly diminished relative to its room temperature adhesiveness. In addition, it desirably has the property of leaving essentially no residual adhesive material on the surface of a pellet to which it is initially attached and from which it is subsequently released. It is also desirable that the adhesive layer 2 be compatible with the plate 1 to insure that the surface of the pellet is substantially free of any excess residual adhesive, namely, no additional cleaning step should be required to remove any such residual adhesive once the pellet is no longer attached to the plate 1. The adhesive layer 2 may be made of an adhesive material such as wax or thermoplastic cements, which have the foregoing properties. One suitable adhesive is Wevo White Wax No. 75 which is commercially available from Associated American Winding Machinery Inc., New York City, New York. Preferably the Wevo Wax No. 75 is mixed with 1 part by weight Xylene to 2 parts by weight Wevo Wax No. 75 for optimum results.

Step (C) shows the attachment of a semiconductor wafer 3 to the orientation plate 1 using the adhesive layer 2. This is accomplished by first heating the orientation plate 1 to a temperature in the range of 75° – 150°C for a time sufficient to soften the adhesive layer 2 which was either previously or currently applied to the top surface of the plate 1. The wafer 3 is next centered and pressed onto the adhesive layer 2. The heat is then removed and the plate 1 is allowed to cool thereby re-solidifying the adhesive material.

Step (D) shows the semiconductor wafer 3 attached to the orientation plate 1 after it has been subdivided into a plurality of semiconductor pellets. This is accomplished in such a way that a network of pedestal-shaped supports 15 are simultaneously produced on the plate 1 in FIG. 2. One preferred method of subdividing semiconductor wafer 3 is to use a cutting tool such as a wire saw in combination with a slurry to form the grooves or notches 4. Once the cutting tool passes through the wafer 3 it continues to cut down into the plate 1, thereby forming pedestal-shaped supports 15. To maximize the use of the wafer 3 as much as possible the width of the grooves 4 should be no greater than that necessary to thermally isolate the supports 15 from one another. The preferred width of the grooves 4 varies from 0.003 to 0.008 inches and is primarily dependent on the shape of the pellets and the width of the cutting tool. The depth by which the grooves 4 extend below the pellet-apparatus interface is not critical as long as the necessary thermal isolation of one pedestal-shaped support from its neighbor is maintained. If necessary, the plate 1 shown in step (D) may be washed in deionized water to remove any excess slurry. It is of course, recognized that other types of cutting methods such as laser cutting, erosion cutting, multi-blade cutting and the like may also be used. In addition, the shape of the grooves 4 may also vary as long as they maintain the thermal isolation requirements between the supports 15.

Thus, the complete structure of the pellet orientation plate 1 is shown in step (D). It is noted that the individual pellets 3 completely cover the top surface of the pedestal-shaped supports 15 and each pellet is in the same relative position and orientation it occupied in the parent wafer 3. In addition, the grooves 4 are so formed that each subdivided pellet 3 is thermally isolated and spaced from each other so that no deleterious effects, such as pellet orientation shift, can occur, due to heat generated, in a neighboring pellet or support.

FIG. 3 is a cross-sectional view of a typical semiconductor pellet 3 to which my invention is particularly applicable. The two circuit elements illustrated as embodied in the semiconductor pellet 3 of FIG. 3 are a PN diode including a P-type conductivity anode region 12 and a N-type conductivity cathode region 11, and a NPN transistor including a N-type conductivity emitter region 8, a P-type conductivity base region 9 and a N-type conductivity collector region 10. The P-type conductivity substrate 5 is used to isolate at least the two above-mentioned circuit elements by diode substrate isolation techniques. The planar junctions of the circuit elements are protected by a protective insulating layer 6. Contact pads 7 are formed on the top surface of the device to provide a means for subsequent bonding to external leads, not shown in FIG. 3. The manufacture of the portions of the semiconductor pellet 3 thus far described will not be disclosed in detail inasmuch as it does not form a part of this invention and is also well known to those skilled in the art. Moreover, it will be understood that, in addition to active elements such as transistors and diodes, passive elements such as resistors and capacitors may be fabricated within the pellet 3 and included in the circuit, although such are not shown in FIG. 3.

A portion of the top surface of each pellet 3 is coated by a suitable known protective insulating layer 6 which may be, for example, silicon dioxide, silicon nitride, or a combination of both. Contact pads 7 of any suitable metallic contact material are provided on the surface of desired regions 8 and 12 best shown in FIG. 3, previously formed on the pellet 3 for cooperation with other regions 9, 10, 11, etc., to form diodes, transistors, resistors or the like. For ease of illustration and understanding of the invention, elements 8, 9, 10, 11 and 12 are not shown in other than FIG. 3. Of course, it is recognized that the active elements formed in pellet 3 may also be a variety of discrete semiconductor elements such as bipolar and unipolar transistors, diodes, thyristors, limited space-charge accumulation elements and the like.

In accordance with the invention, the pellets 3 secured on the orientation plate 1 as shown in FIG. 1, step (D) are presented at a suitable work station, pellet by pellet, for attachment of external leads to the respective contact pads 7 of each pellet. One suitable apparatus, useful in performing these steps is shown in FIGS. 4–6. FIG. 4 shows a fragmentary cross-sectional view of a portion of the pellet orientation plate 1 wherein the upstanding contact pads 7 located on the pellet 3 are in registration directly beneath a suitable vertically reciprocable thermal bonding tool 61. External leads 62, attached to a suitable support 63, are placed in registry between the tool 61 and the respective contact pads 7. The tool 61 is then lowered into engaging relationship with the leads 62 as shown in FIG. 5 thereby providing the means necessary to form a good bond between the leads 62 and the respective contact pads 7. The heat associated with this bonding technique transfers through pellet 3 and releases the grip of the adhesive layer 2 on the heated pellet. In order to remove any excess residual adhesive material which may remain after the pellet has been released from the pedestal, the properties of the heat conductive material and the adhesive material should be matched so that the orientation plate 1 absorbs this excess residual adhesive during the thermal bonding step. One suitable match-up is the use of a plate 1 made of Hysol-XSCM11-454-Epoxy available from Hysol Corporation, Olean, New York and an adhesive made of 2 parts by weight Wevo No. 75 white wax available from Associated American Winding Machinery Inc., New York City, New York and 1 part by weight Xylene. A suitable feeding means known to those skilled in the art is used to provide a new set of external leads into bonding position with the contact areas 7 as they are needed. Upon removal of the tool 61 as shown in FIG. 6 the pellet 3 with attached external leads 62 can then be easily removed from the top of the pedestal 15 of the orientation plate 1 by a lifting action supplied by means associated with the lead-feeding means and applied to the leads 62 either manually or automatically. Then the bonding tool 61 and the pellet orientation plate 1 are relatively indexed laterally so as to bring the next pellet 3 into vertical registry with the bonding tool 61, and the bonding cycle as shown in FIG. 4–6 is repeated again until all the individual pellets have had their leads attached.

It is, of course, recognized that any suitable means of bonding which provides sufficient heat to release the pellets from the orientation plate may be used to attach the leads. Further, the attachment of these leads may be accomplished either automatically or manually depending on preference. In addition, the number of leads attached can vary depending upon device requirements thereby requiring only slight modification in the location and number of tools used in the bonding mechanism.

Thus it will be evident that an important advantage of the present invention is that the pellets received in the pellet orientation plate are preserved in the original orientation they occupied in the parent wafer. This enables such pellets to be automatically and precisely indexed relative to a work station at which leads are automatically bonded to contacts on each pellet, with a minimum involvement of direct labor, manual vernier positioning and the like.

It will be appreciated by those skilled in the art that the invention may be carried out in various ways and may take various forms and embodiments other than the illustrative embodiments heretofore described. Accordingly, it is to be understood that the scope of the invention is not limited by the details of the foregoing description, but will be defined in the following claims.

What we claim as new and desire to secure by Letters Patent of the United States is:

1. In an improved semiconductor lead attachment system for applying external leads to contact areas formed on semiconductor pellets which previously constituted a parent wafer, said system having thermal bonding means for joining to said contact areas external leads registered in bonding relation therewith, and having lead-feeding means for feeding successive sets of external leads into bonding relation with the contact areas of pellets successively indexed into bonding relation with the thermal bonding means, wherein a plurality of said semiconductor pellets are secured to the top of pedestal-shaped supports defined by a network of grooves in a semiconductor orientation plate of heat conductive material by a layer of thermally variable adhesive, said pellets being in the same relative position to each other that they occupied in said parent wafer before application thereto to said plate, the improvement comprising heating means associated with said bonding means for reducing the adhesiveness of said adhesive layer during joining of each external lead to its respective contact area to facilitate release of the bonded pellet from the pedestal-shaped support, and means associated with the lead-feeding means for removing from its pedestal each successive heated pellet to which leads are bonded.

2. In an improved semiconductor lead attachment system as defined in Claim 1, said heat conductivity material having the ability to absorb any excess residual adhesive material remaining during the bonding step thereby assuring a clear pellet surface.

* * * * *